(12) United States Patent
Heinrich et al.

(10) Patent No.: US 11,605,608 B2
(45) Date of Patent: Mar. 14, 2023

(54) PREFORM DIFFUSION SOLDERING

(71) Applicant: Infineon Technologies Austria AG, Villach (AT)

(72) Inventors: Alexander Heinrich, Bad Abbach (DE); Konrad Roesl, Teublitz (DE); Kirill Trunov, Warstein (DE); Arthur Unrau, Geseke (DE)

(73) Assignee: Infineon Technologies Austria AG, Villach (AT)

( * ) Notice: Subject to any disclaimer, the term of this patent is extended or adjusted under 35 U.S.C. 154(b) by 83 days.

(21) Appl. No.: 16/679,408

(22) Filed: Nov. 11, 2019

(65) Prior Publication Data

US 2021/0143120 A1 May 13, 2021

(51) Int. Cl.
*H01L 23/00* (2006.01)

(52) U.S. Cl.
CPC .............. *H01L 24/29* (2013.01); *H01L 24/27* (2013.01); *H01L 2924/0105* (2013.01); *H01L 2924/01031* (2013.01); *H01L 2924/01047* (2013.01); *H01L 2924/01048* (2013.01); *H01L 2924/01049* (2013.01); *H01L 2924/01083* (2013.01)

(58) Field of Classification Search
CPC ......... B23K 1/0016; B23K 1/20; H01L 24/29; H01L 24/32
See application file for complete search history.

(56) References Cited

U.S. PATENT DOCUMENTS

| 2007/0166877 | A1 | 7/2007 | Otremba |
| 2008/0164488 | A1 | 7/2008 | Ikeda et al. |
| 2009/0236686 | A1 | 9/2009 | Shim et al. |
| 2011/0017803 | A1 | 1/2011 | Guth et al. |
| 2011/0220704 | A1* | 9/2011 | Liu ...................... B23K 35/262 228/252 |

(Continued)

FOREIGN PATENT DOCUMENTS

| DE | 10201781 A1 | 8/2003 |
| DE | 102007012689.3 B3 | 7/2008 |

(Continued)

OTHER PUBLICATIONS

Wang, Y., et al., "Challenges and Trends of High Power IGBT Module Packaging", IEEE Conference and Expo Transportation Electrification Asia-Pacific, Aug. 31, 2014, pp. 1-7.

*Primary Examiner* — Sarah K Salerno
(74) *Attorney, Agent, or Firm* — Murphy, Bilak & Homiller, PLLC

(57) ABSTRACT

A method of joining a semiconductor die to a substrate includes: applying a solder preform to a metal region of the semiconductor die or to a metal region of the substrate, the solder preform having a maximum thickness of 30 μm and a lower melting point than both metal regions; forming a soldered joint between the metal region of the semiconductor die and the metal region of the substrate via a diffusion soldering process and without applying pressure directly to the die; and setting a soldering temperature of the diffusion soldering process so that the solder preform melts and fully reacts with the metal region of the semiconductor die and the metal region of the substrate to form one or more intermetallic phases throughout the entire soldered joint, each intermetallic phase having a melting point above the melting point of the preform and the soldering temperature.

18 Claims, 4 Drawing Sheets

(56) References Cited

U.S. PATENT DOCUMENTS

| | | | |
|---|---|---|---|
| 2012/0305632 A1* | 12/2012 | Ross | .................... H01L 23/36 |
| | | | 228/180.21 |
| 2013/0049204 A1 | 2/2013 | Oeschler et al. | |
| 2013/0200532 A1 | 8/2013 | Otremba et al. | |
| 2015/0115452 A1 | 4/2015 | Yoon et al. | |
| 2015/0228616 A1 | 8/2015 | Palm et al. | |
| 2015/0279804 A1 | 10/2015 | Raravikar et al. | |
| 2016/0126197 A1 | 5/2016 | Matoy et al. | |
| 2016/0126211 A1 | 5/2016 | Hohlfeld et al. | |
| 2017/0207123 A1 | 7/2017 | Mischitz et al. | |
| 2017/0271298 A1* | 9/2017 | Heinrich | ............. H01L 23/5385 |

FOREIGN PATENT DOCUMENTS

| | | | |
|---|---|---|---|
| DE | 102017004626 A1 | 11/2018 | |
| WO | WO-2018192987 A1 * | 10/2018 | ........... B23K 1/0016 |

* cited by examiner

PREFORM DIFFUSION SOLDERING

BACKGROUND

Thermal and electrical performance play an increasing role in the advancement of semiconductor technologies. These factors, coupled with miniaturization and increased performance, demand a high performance die (chip) attach process and material. Diffusion soldering is one such die attach process.

Diffusion soldering involves sputtering a thin layer of solder material onto the backside of a semiconductor wafer. The deposition of the solder material represents a significant fraction of the overall wafer cost. In addition, a high force is used during the die attach process to achieve a form-fit interconnect, as the sputtered solder layer is thin and the lead frame to which the devices are attached has a defined curvature.

The diffusion soldering process described above also requires specialized equipment, including a bond force unit for applying the high force to the devices to achieve a form-fit interconnect. Furthermore, mechanical pressure is applied individually to each die and must be maintained until a significant portion of the solder has solidified isothermally, limiting the throughput of the die attach process. In addition, the soldering temperature must be high to enable a full reaction and isothermal solidification in a short time.

Thus, there is a need for an improved diffusion soldering process.

SUMMARY

According to an embodiment of a method of joining a semiconductor die to a substrate, the method comprises: applying a solder preform to a metal region of the semiconductor die or to a metal region of the substrate, the solder preform having a maximum thickness of 30 µm, e.g., a maximum thickness of 15 µm, e.g., a maximum thickness of 10 µm or even 7 µm and a lower melting point than both the metal region of the semiconductor die and the metal region of the substrate; forming a soldered joint between the metal region of the semiconductor die and the metal region of the substrate via a diffusion soldering process and without applying pressure directly to the semiconductor die; and setting a soldering temperature of the diffusion soldering process so that the solder preform melts and fully reacts with the metal region of the semiconductor die and the metal region of the substrate to form one or more intermetallic phases throughout the entire soldered joint, each of the one or more intermetallic phases having a melting point above the melting point of the preform and the soldering temperature.

The metal region of the semiconductor die and the metal region of the substrate may comprise the same metal or metal alloy, and a single intermetallic phase may be formed throughout the entire soldered joint by the diffusion soldering process.

Separately or in combination, the solder preform may comprise Sn, Zn, In, Ga, Bi, Cd or any alloy thereof.

Separately or in combination, the solder preform may comprise Sn/Ag/Cu, Sn/Ag, Sn/Ag/Sb, Sn/Sb, Sn/Cu or Au80/Sn20.

Separately or in combination, the substrate may be a leadframe or a metal clip and the metal region of the substrate may be a die attach region of the leadframe or the metal clip.

Separately or in combination, the substrate may comprise a ceramic and the metal region of the substrate may be a metal layer attached to the ceramic. The metal layer may comprise and/or is plated with Cu, Ni, Ag, Au, Pd, Pt, NiV, NiP, NiNiP, NiP/Pd, Ni/Au, NiP/Pd/Au, or NiP/Pd/AuAg.

Separately or in combination, the metal region of the semiconductor die may be a metal layer applied to a back side or a front side of the semiconductor die. The metal layer may comprise and/or is plated with Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag.

Separately or in combination, applying the solder preform to the metal region of the semiconductor die or to the metal region of the substrate may comprise: applying a first liquid to the substrate; placing the solder preform on the substrate, wherein the first liquid maintains a position of the solder preform relative to the substrate by surface tension; applying a second liquid to the solder preform; and placing the semiconductor die on the solder preform, wherein the second liquid maintains a position of the semiconductor die relative to the solder preform by surface tension.

Separately or in combination, the diffusion soldering process may comprise: placing the semiconductor die arranged on the solder preform and the substrate in a vacuum oven; introducing formic acid into the vacuum oven; and increasing the temperature of the vacuum oven to the soldering temperature for a duration over which the solder preform melts and fully reacts with the metal region of the semiconductor die and the metal region of the substrate to form the one or more intermetallic phases throughout the entire soldered joint, without applying pressure directly to the semiconductor die.

Separately or in combination, a plurality of semiconductor dies may be attached to respective substrates in parallel during the diffusion soldering process.

Separately or in combination, the solder preform may have a smaller width and/or a smaller length than the metal region of the semiconductor die prior to the diffusion soldering process, and the solder preform may melt and spread over the entire metal region of the semiconductor die during the diffusion soldering process so that the resulting soldered joint is thinner than the initial maximum thickness of the solder preform.

Separately or in combination, the method may further comprise introducing formic acid, as part of the diffusion soldering process, into a vacuum oven that contains the semiconductor die, the solder preform and the substrate, to increase wettability of the metal region of the semiconductor die and the metal region of the substrate.

Separately or in combination, applying the solder preform to the metal region of the semiconductor die or to the metal region of the substrate may comprise: applying the solder preform to a front side or a back side of a semiconductor wafer which includes the semiconductor die and a plurality of additional semiconductor dies; and after applying the solder preform to the front side or the back side of the semiconductor wafer, singulating the semiconductor die and the plurality of additional semiconductor dies.

Separately or in combination, applying the solder preform to the metal region of the semiconductor die or to the metal region of the substrate may comprise: heating the semiconductor die; applying the solder preform to a front side or a back side of the semiconductor die; and stamping the solder preform with the semiconductor die.

According to an embodiment of a semiconductor device, the semiconductor device comprises: a semiconductor die having a metal region; a substrate having a metal region; and a soldered joint between the metal region of the semiconductor die and the metal region of the substrate. One or more intermetallic phases are present throughout the entire soldered joint, each of the one or more intermetallic phases formed from a solder preform diffused into the metal region of the semiconductor die and the metal region of the substrate. The soldered joint has the same length-to-width aspect ratio as the semiconductor die. The metal region of the semiconductor die and the metal region of the substrate may comprise the same metal or metal alloy, and a single intermetallic phase may be present throughout the entire soldered joint.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a joining technique which involves applying a thin solder preform to a metal region of a semiconductor die or to a metal region of a substrate, and forming a soldered joint between the metal region of the semiconductor die and the metal region of the substrate via a diffusion soldering process and without applying (mechanical) pressure directly to the semiconductor die. The solder preform is thin enough, e.g., at most 30 µm thick, so that a soldering temperature of the diffusion soldering process may be set so that the solder preform melts and fully reacts with the metal region of the semiconductor die and the metal region of the substrate to form one or more intermetallic phases throughout the entire soldered joint. Since (mechanical) pressure is not directly applied to the semiconductor die during the diffusion soldering process, multiple semiconductor dies may be processed at the same time via batch processing.

Figure 1:
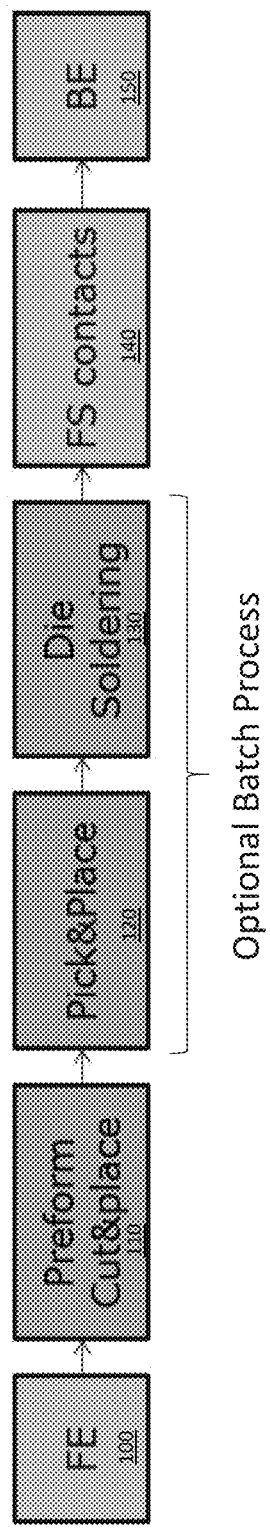
FIG. 1 illustrates a block diagram of an embodiment of a method of joining a semiconductor die to a substrate using a thin solder preform.

FIG. 1 illustrates an embodiment of the joining technique for semiconductor dies. According to this embodiment, standard front-end (FE) processing such as etching, grinding, polishing, structuring and/or metal deposition for source, gate and drain contacts may be performed (Block 100) and a thin solder preform cut and placed on a metal region of a semiconductor die or on a metal region of a substrate (Block 110). The thin solder preform material can be stamped or cut from a reel of preform solder material as part of the joining technique, or can be a pre-cut preform, a pre-stamped preform, etc.

The thin solder preform may be applied during die assembly, or may be pre-applied to the substrate or a semiconductor wafer. In one embodiment, the thin solder preform is applied to a front side or a back side of a semiconductor wafer which includes the semiconductor die and a plurality of additional semiconductor dies. After applying the thin solder preform to the semiconductor wafer, the semiconductor dies are singulated, e.g., by sawing, laser cutting, etching, etc. The thin solder preform may instead be applied after the die singulation process. For example, the semiconductor die may be heated and the thin solder preform may be applied to a front side or a back side of the heated semiconductor die. The thin solder preform may be stamped with the semiconductor die. In the case of pre-applying the thin solder preform to the substrate, the thin solder preform may be applied by roll cladding, pre-melting, printing and re-casting, etc. In general, the joining technique may be carried out free of flux, as the die attach process may be done in a vacuum environment with formic acid. This is also valid for a printed thin solder preform, where the paste may be free of flux, as the surfaces may be cleaned with formic acid during the joining technique.

For batch processing during which more than one semiconductor die is to be soldered at the same time, multiple preforms are placed on the same or different die/substrate. This way, all semiconductor dies to be soldered at the same time may be joined to the same substrate, joined to individual substrates, or joined in respective groups to separate substrates.

For either serial or batch processing, the thin solder preform may be cut by stamping, laser cutting, etching, etc. In the case of the batch processing, thin solder preforms processed at the same time may have the same or different thicknesses depending on the types of semiconductor dies and substrates to be joined.

For those semiconductor dies being attached to a substrate using a thin solder preform via diffusion soldering, each thin solder preform is a formed of solder that is thin and extremely uniform, e.g., such as a thin metal film or foil, and has a maximum thickness of 30 µm (microns), e.g., a maximum thickness of 15 µm, e.g., a maximum thickness of 10 µm or even thinner down to 7 µm. In the case of batch processing, some semiconductor dies may be attached to a substrate using a thicker solder preform having a maximum thickness greater than 30 µm or using a solder paste.

In general, the term 'thin solder preform' as used herein means a solder preform having a maximum thickness of 30 µm and a lower melting point than both the metal region of the semiconductor die and the metal region of the substrate to be joined by the thin solder preform. Such a thin solder preform fully reacts with the die backside metal and the substrate material during the diffusion soldering process, and the resulting soldered joint (bond line) formed between the semiconductor die and substrate has a high melting phase throughout the entire soldered joint. At thicknesses above 30 µm and for soft solder pastes, a high melting phase is not producible throughout the entire soldered joint in a reasonable amount of time, and thus the middle part of the resulting soldered joint will not be converted to an intermetallic compound and will instead remain at the original melting temperature. The term 'high melting phase' as used herein means an intermetallic phase having a melting point above the melting point of the preform and above the soldering temperature of the diffusion soldering process.

The joining technique illustrated in FIG. 1 also includes picking and placing each semiconductor die to be processed on a corresponding substrate (Block 120). As described above, in the case of batch processing, all semiconductor dies to be soldered at the same time may be placed on the same substrate, placed on individual substrates, or placed on respective groups of separate substrates.

The joining technique illustrated in FIG. 1 also includes forming a soldered joint between the metal region of each semiconductor die being soldered at the same time and the metal region of the corresponding substrate (Block 130). For each semiconductor die being joined to a substrate by a thin solder preform, the corresponding soldered joint is formed by diffusion soldering without applying (mechanical) pressure directly to the semiconductor die. By using a thin solder preform that is at most 30 μm thick, the soldering temperature of the diffusion soldering process may be set so that the solder preform melts and fully reacts with the metal region of the semiconductor die and the metal region of the substrate to form one or more intermetallic phases throughout the entire soldered joint. Each intermetallic phase has a melting point above the melting point of the preform and the soldering temperature.

By not applying direct pressure to the semiconductor die as part of the diffusion soldering process, multiple dies may be soldered at the same time without concern for different thicknesses of the dies, substrates and/or die attach materials. This way, some semiconductor dies may be soldered using thin solder preforms, other semiconductor dies may be soldered using thicker solder preforms, and still other semiconductor dies may be soldered using solder paste. For each semiconductor die soldered using a thin solder preform, if the metal region of the semiconductor die and the metal region of the substrate comprise the same metal or metal alloy, a single intermetallic phase is formed throughout the entire soldered joint by the diffusion soldering process.

The joining technique illustrated in FIG. 1 may also include standard front side (FS) contact formation processing (Block 140), which may include forming electrically conductive structures for source and gate contacts and a solderable front side metallization and standard back-end (BE) processing (Block 150), which may include depositing a metallic layer stack for electrically connecting the drain contact. The front side contact formation processing and standard back-end processing may be performed using the same or different equipment, lines and/or sites as the diffusion soldering process represented by Blocks 110 through 130.

FIGS. 2A through 2D illustrate an embodiment of Blocks 110 through 130 of the method shown in FIG. 1. While FIGS. 2A through 2D show a single semiconductor die 200 being joined to a single substrate 202 by diffusion soldering using a thin solder preform 204, more than one semiconductor die may be soldered at the same time to the same substrate, joined to individual substrates, or joined in respective groups to separate substrates, as previously explained herein.

Figure 2:
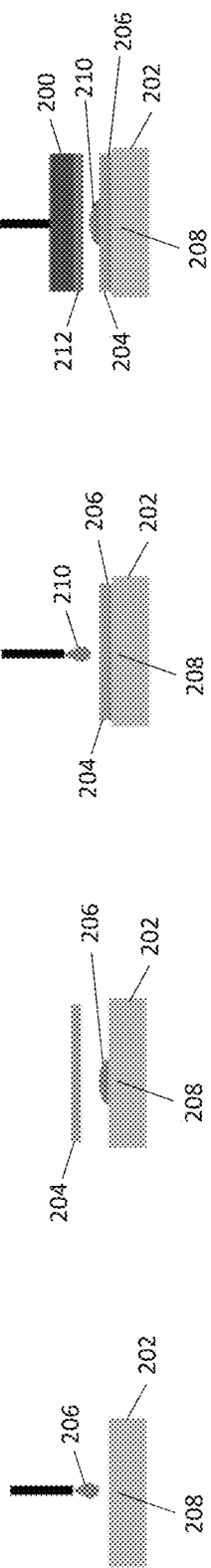
FIGS. 2A through 2D illustrate respective cross-sectional views of an embodiment of Blocks 110 through 130 of the method shown in FIG. 1.

FIG. 2A shows a first liquid 206 being applied to the substrate 202. In one embodiment, the first liquid 206 is a volatile, non-reactive liquid which keeps the thin solder preform 204 in place on the substrate 202 by surface tension. Any type of substrate to which a semiconductor die is typically joined may be used. For example, in one embodiment, the substrate 202 is a leadframe or a metal clip having a metal die attach region 208 to which the semiconductor die 200 is to be joined. The leadframe or metal clip may comprise Cu, Ni and/or Ag, for example. In another embodiment, the substrate 202 comprises a ceramic and a metal layer attached to the ceramic and to which the semiconductor die 200 is to be joined. In one embodiment, the metal layer comprises and/or is plated with Cu, Ni, Ag, Au, Pd, Pt, NiV, NiP, NiNiP, NiP/Pd, Ni/Au, NiP/Pd/Au, or NiP/Pd/AuAg. Still other types of metals/metal alloys and substrates may be used.

FIG. 2B shows the thin solder preform 204 during placement on the substrate 202 with the first liquid 206. The first liquid 206 maintains the position of the thin solder preform 204 relative to the substrate 202 by surface tension.

In one embodiment, the thin solder preform 204 comprises Sn, Zn, In, Ga, Bi, Cd or any alloy thereof. For example, the thin solder preform 204 may comprise Sn/Ag/Cu, Sn/Ag, Sn/Ag/Sb, Sn/Sb, Sn/Cu or Au80/Sn20. Still other types of thin solder preforms may be used. Alternatively, the thin solder preform 204 may be applied to the semiconductor die 200 instead of the substrate 202. In this case, the substrate 202 in FIG. 2B instead would be the semiconductor die 200 or a semiconductor wafer from which the die 200 is produced. For example, the thin solder preform 204 may be applied to a front side or a back side of a semiconductor wafer which includes the semiconductor die 200 and a plurality of additional semiconductor dies, or may be applied to the front side or back side of the semiconductor die 200 after the die singulation process, both as previously described herein.

FIG. 2C shows a second liquid 210 being applied to the thin solder preform 204. In one embodiment, the second liquid 210 is a volatile, non-reactive liquid which keeps the semiconductor die 200 in place on the thin solder preform 204 by surface tension. The first and second liquids 206, 210 may be the same or different type of liquid.

FIG. 2D shows the semiconductor die 200 during placement on the thin solder preform 204 with the second liquid 210. The second liquid 210 maintains the position of the semiconductor die 200 relative to the thin solder preform 204 by surface tension. A clamping mechanism (not shown) may be used to handle the thin solder preform 204, to transport the assembly to a diffusion soldering oven.

A soldered joint is then formed between a metal region 212 of the semiconductor die 200 facing the substrate 202 and the metal region 208 of the substrate 202 via a diffusion soldering process and without applying (mechanical) pressure directly to the semiconductor die 200. The metal region 212 of the semiconductor die 200 may be a metal layer applied to the back side or front side of the semiconductor die 200. In one embodiment, the metal region 212 of the semiconductor die 200 comprises and/or is plated with Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag. The metal region 212 may be a terminal of the semiconductor die 200, e.g., a load or control terminal in the case of a power transistor die, a control or I/O (input/output) terminal in the case of a logic die such as a gate driver, microcontroller, memory, etc., a terminal of a passive die such as an inductor or capacitor die, etc.

The metal region 212 of the semiconductor die 200 and the metal region 208 of the substrate 202 to be joined together by diffusion soldering process and the thin solder preform 204 may comprise the same or different metal/metal alloy. If the metal region 212 of the semiconductor die 200 and the metal region 208 of the substrate 202 comprise the same metal or metal alloy, a single intermetallic phase is formed throughout the entire soldered joint formed between the die 200 and substrate 202, as previously explained herein. For example, if the metal region 212 of the semiconductor die 200 and the metal region 208 of the substrate 202 to be joined both comprise Cu or the same Cu-rich alloy, Cu will dissolve via the liquified preform material during the diffusion soldering process until a certain concentration is reached, at which point the joint solidifies. The resulting Cu-based intermetallic phase will not melt again at the solder temperature of the diffusion soldering process. The same applies for other types of common die and substrate metallization such as Ni-rich and Ag-rich alloys, for example.

If the metal region 212 of the semiconductor die 200 and the metal region 208 of the substrate 202 comprise a different metal/metal alloy, a plurality of intermetallic phases are formed throughout the entire soldered joint. In either case, the thin solder preform 204 fully reacts with the die metal 212 and the substrate metal 208 during the diffusion solder process so that the soldered joint formed between the die 200 and substrate 202 has a high melting phase throughout the entire soldered joint.

Figure 3:
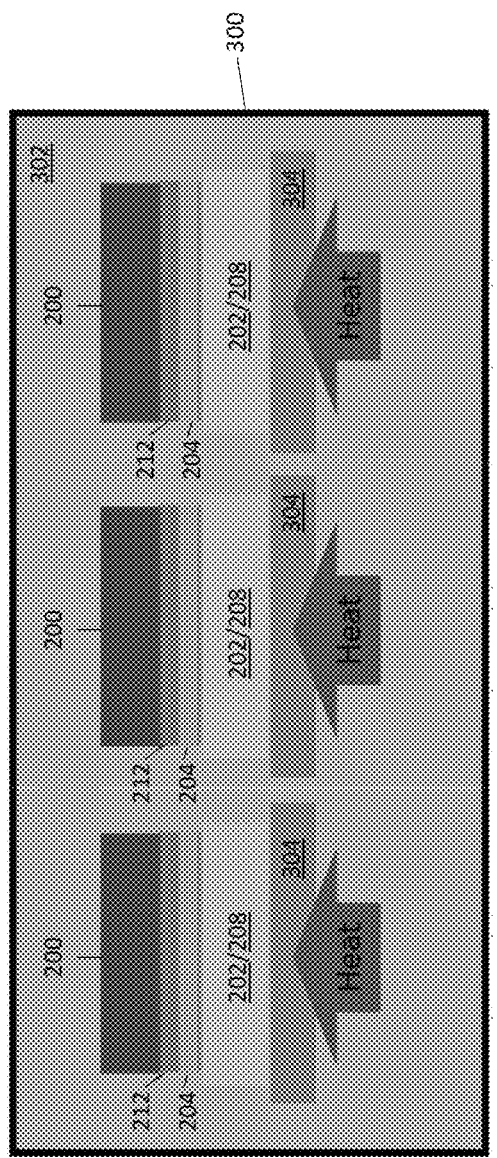
FIG. 3 illustrates a cross-sectional view of another embodiment of Block 130 of the method shown in FIG. 1.

FIG. 3 illustrates an embodiment of the diffusion soldering process represented by Blocks 110 through 130 in FIG. 1. FIG. 3 shows a plurality of semiconductor dies 200 being joined to individual substrates 202 by diffusion soldering using a thin solder preform 204. As explained previously herein, batch or serial processing may be employed, and more than one semiconductor die may be soldered at the same time to the same substrate, joined to individual substrates, or joined in respective groups to separate substrates.

The diffusion soldering process illustrated in FIG. 3 includes placing at least one semiconductor die 200 arranged on a thin solder preform 204 and a corresponding substrate 202 in a vacuum oven 300. Formic acid 302 is then introduced into the vacuum oven 300. The formic acid 302 removes oxidation from the substrate 202, die metallization 212 and thin solder preform 204, thereby increasing wettability of the die metallization 212 and the substrate metallization 208 and completely filling the space between the die 200 and substrate 202. The temperature of the vacuum oven is increased, e.g., by a heating element 304 under vacuum conditions to the soldering temperature for a duration over which each thin solder preform 204 melts and fully reacts with the die metallization 212 and the substrate metallization 208 to form one or more intermetallic phases throughout the entire soldered joint. The diffusion soldering process is performed without applying (mechanical) pressure directly to the semiconductor dies 200. With this approach, standard diffusion soldering equipment may be used without redesign.

Each semiconductor device produced from the diffusion soldering process illustrated in FIG. 3 by using a thin solder preform 204 has at least one semiconductor die 200 with a metal region 212, at least one substrate 202 with a metal region 208, and a soldered joint between the die metallization 212 and the substrate metallization 208. One or more intermetallic phases are present throughout the entire soldered joint, each intermetallic phases being formed from the thin solder preform 204 diffused into the die metallization 212 and the substrate metallization 208.

No squeeze out of solder material occurs from under the die 200 during the diffusion solder process, since no (mechanical) pressure is applied directly to the semiconductor die 200. If pressure were applied to the semiconductor die 200 as is typically done during diffusion soldering, bubbles of liquid solder material would squeeze out from under the semiconductor die 200 as a result of the pressing, yielding a scalloped like structure along the periphery of the die 200. With the diffusion soldering process described herein, there may be some capillary effect along the edge of the semiconductor die 200, but the capillary effect will be uniformly defined and the same around the entire periphery of the die 200. This means that the soldered joint does not exceed the lateral (length and width) dimensions of the semiconductor die 200, and has the same length-to-width aspect ratio as the semiconductor die 200. Also, as previously described herein, the die metallization 212 and the substrate metallization 208 may comprise the same metal or metal alloy so that a single intermetallic phase is present throughout the entire soldered joint.

Figures 4A, 4B:
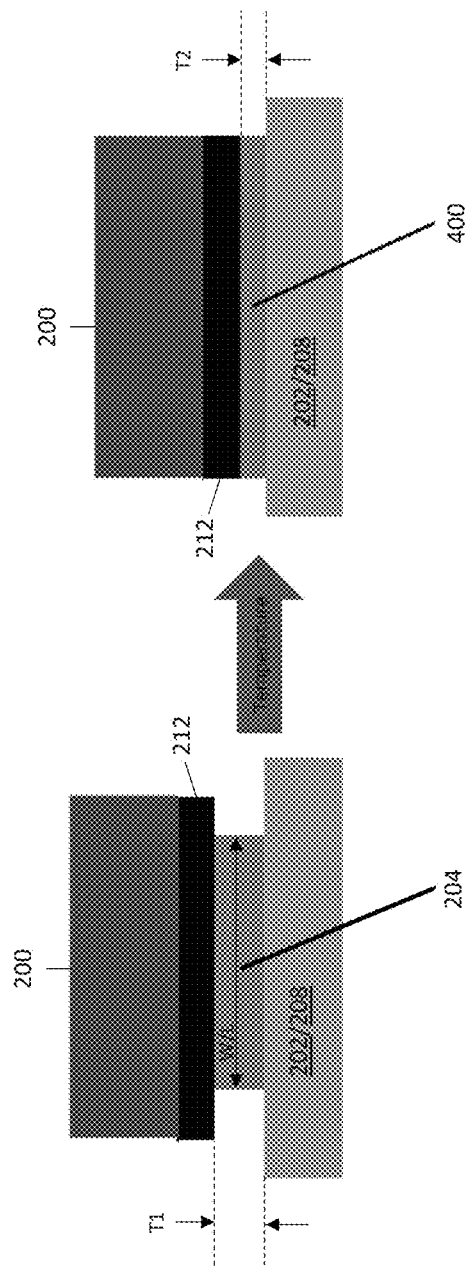
FIGS. 4A and 4B illustrate respective cross-sectional views of another embodiment of Blocks 110 through 130 of the method shown in FIG. 1.

FIGS. 4A and 4B illustrate another embodiment of Blocks 110 through 130 of the method shown in FIG. 1. According to this embodiment, the thin solder preform 204 has a smaller width and/or a smaller length (W/L) than the metal region 212 of the semiconductor die 200 prior to the diffusion soldering process, as shown in FIG. 4A. The thin solder preform 204 melts and spreads over the entire metal region 212 of the semiconductor die 200 during the diffusion soldering process, so that the resulting soldered joint 400 has a thickness (T2) which is less than the initial maximum thickness (T1) of the solder preform 204, as shown in FIG. 4B. This way, a soldered joint 400 can be realized which is thinner than the thinnest available solder preform 204.

Provisioning the die attach material 204 independent from the die metallization 212 yields several advantages. A thin solder preform 204 may be chosen smaller than lateral dimensions of the semiconductor die 200, e.g., as illustrated in FIGS. 4A and 4B, to enable narrow design rule/low clearance. Furthermore, the use of formic acid 302 as part of the diffusion soldering process provides excellent wetting of the thin solder preform 204 on the substrate 202, completely filling space between the semiconductor die 200 and substrate 202. Also with this approach, the type of solder preform/material may be exchanged easily without requiring modifications to the joining/diffusion soldering process.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of joining a semiconductor die to a substrate, the method comprising:
applying a solder preform to a metal region of the semiconductor die or to a metal region of the substrate, the solder preform having a maximum thickness of 30 μm and a lower melting point than both the metal region of the semiconductor die and the metal region of the substrate;

forming a soldered joint between the metal region of the semiconductor die and the metal region of the substrate via a diffusion soldering process and without applying pressure directly to the semiconductor die; and setting a soldering temperature of the diffusion soldering process so that the solder preform melts and fully reacts with the metal region of the semiconductor die and the metal region of the substrate, and the entire soldered joint is converted to an intermetallic compound having a melting point above the melting point of the preform and the soldering temperature.

2. The method of claim 1, wherein the solder preform has a maximum thickness of 15 μm.

3. The method of claim 1, wherein the solder preform has a maximum thickness of 7 μm.

4. The method of claim 1, wherein the metal region of the semiconductor die and the metal region of the substrate comprise the same metal or metal alloy, and wherein a single intermetallic phase is formed throughout the entire soldered joint by the diffusion soldering process.

5. The method of claim 1, wherein the solder preform comprises Sn, Zn, In, Ga, Bi, Cd or any alloy thereof.

6. The method of claim 1, wherein the solder preform comprises Sn/Ag/Cu, Sn/Ag, Sn/Ag/Sb, Sn/Sb, Sn/Cu or Au80/Sn20.

7. The method of claim 1, wherein the substrate is a leadframe or a metal clip, and wherein the metal region of the substrate is a die attach region of the leadframe or the metal clip.

8. The method of claim 1, wherein the substrate comprises a ceramic, and wherein the metal region of the substrate is a metal layer attached to the ceramic.

9. The method of claim 8, wherein the metal layer comprises and/or is plated with Cu, Ni, Ag, Au, Pd, Pt, NiV, NiP, NiNiP, NiP/Pd, Ni/Au, NiP/Pd/Au, or NiP/Pd/AuAg.

10. The method of claim 1, wherein the metal region of the semiconductor die is a metal layer applied to a back side or a front side of the semiconductor die.

11. The method of claim 10, wherein the metal layer comprises and/or is plated with Cu, Ni, Ag, Au, Pd, Pt, NiV, NiP, NiNiP, NiP/Pd, Ni/Au, NiP/Pd/Au, NiP/Pd/AuAg, NiV/Ag, NiV/Au, or NiSi/Ag.

12. The method of claim 1, wherein applying the solder preform to the metal region of the semiconductor die or to the metal region of the substrate comprises:
applying a first liquid to the substrate;
placing the solder preform on the substrate, wherein the first liquid maintains a position of the solder preform relative to the substrate by surface tension;
applying a second liquid to the solder preform; and
placing the semiconductor die on the solder preform, wherein the second liquid maintains a position of the semiconductor die relative to the solder preform by surface tension.

13. The method of claim 12, wherein the diffusion soldering process comprises:
placing the semiconductor die arranged on the solder preform and the substrate in a vacuum oven;
introducing formic acid into the vacuum oven; and
increasing the temperature of the vacuum oven to the soldering temperature for a duration over which the solder preform melts and fully reacts with the metal region of the semiconductor die and the metal region of the substrate to convert the entire soldered joint to the intermetallic compound, without applying pressure directly to the semiconductor die.

14. The method of claim 1, wherein a plurality of semiconductor dies are attached to respective substrates in parallel during the diffusion soldering process.

15. The method of claim 1, wherein the solder preform has a smaller width and/or a smaller length than the metal region of the semiconductor die prior to the diffusion soldering process, and wherein the solder preform melts and spreads over the entire metal region of the semiconductor die during the diffusion soldering process, so that the resulting soldered joint is thinner than the initial maximum thickness of the solder preform.

16. The method of claim 15, further comprising:
introducing formic acid, as part of the diffusion soldering process, into a vacuum oven that contains the semiconductor die, the solder preform and the substrate, to increase wettability of the metal region of the semiconductor die and the metal region of the substrate.

17. The method of claim 1, wherein applying the solder preform to the metal region of the semiconductor die or to the metal region of the substrate comprises:
applying the solder preform to a front side or a back side of a semiconductor wafer which includes the semiconductor die and a plurality of additional semiconductor dies; and
after applying the solder preform to the front side or the back side of the semiconductor wafer, singulating the semiconductor die and the plurality of additional semiconductor dies.

18. The method of claim 1, wherein applying the solder preform to the metal region of the semiconductor die or to the metal region of the substrate comprises:
heating the semiconductor die;
applying the solder preform to a front side or a back side of the semiconductor die; and
stamping the solder preform with the semiconductor die.

* * * * *